United States Patent
Mege et al.

(10) Patent No.: US 9,189,321 B2
(45) Date of Patent: *Nov. 17, 2015

(54) ERROR CORRECTION ENCODING METHOD, DECODING METHOD AND ASSOCIATED DEVICES

(75) Inventors: Philippe Mege, Bourg la Reine (FR); Hang Nguyen, Bretigny sur Orge (FR); Laurent Martinod, Le Chesnay (FR); Alina Alexandra Florea, Montigny le Bretonneux (FR)

(73) Assignee: CASSIDIAN SAS, Elancourt (FR)

( * ) Notice: Subject to any disclaimer, the term of this patent is extended or adjusted under 35 U.S.C. 154(b) by 136 days.

This patent is subject to a terminal disclaimer.

(21) Appl. No.: 14/004,796

(22) PCT Filed: Mar. 14, 2012

(86) PCT No.: PCT/EP2012/054500
§ 371 (c)(1),
(2), (4) Date: Sep. 12, 2013

(87) PCT Pub. No.: WO2012/123517
PCT Pub. Date: Sep. 20, 2012

(65) Prior Publication Data
US 2014/0006895 A1    Jan. 2, 2014

(30) Foreign Application Priority Data
Mar. 15, 2011  (FR) .................................... 11 52107

(51) Int. Cl.
*H03M 13/00*  (2006.01)
*G06F 11/08*  (2006.01)
(Continued)

(52) U.S. Cl.
CPC ........... *G06F 11/08* (2013.01); *H03M 13/2948* (2013.01); *H03M 13/2972* (2013.01);
(Continued)

(58) Field of Classification Search
CPC . G06F 11/08; H03M 13/2972; H03M 13/356; H03M 13/3905; H03M 13/6362; H03M 13/2948; H03M 13/27; H03M 13/296; H03M 13/1102; H03M 13/1194; H03M 13/132; H03M 13/136; H03M 13/1505; H03M 13/1515; H03M 13/152; H03M 13/19; H03M 13/2966
See application file for complete search history.

(56) References Cited

U.S. PATENT DOCUMENTS

| | | | |
|---|---|---|---|
| 5,446,747 A | 8/1995 | Berrou | |
| 2004/0146109 A1* | 7/2004 | Kondo et al. | 375/240.16 |
| 2012/0113928 A1* | 5/2012 | Hwang et al. | 370/329 |

FOREIGN PATENT DOCUMENTS

WO        96/32781    * 10/1996  ............ H03M 13/00

OTHER PUBLICATIONS

Frank Burkert et al., "'Turbo' Decoding with Unequal Error Protection Applied to GSM Speech Coding", Global Telecommunications Conference, vol. 3, Nov. 18, 1996, pp. 2044-2048.
(Continued)

*Primary Examiner* — Guerrier Merant
(74) *Attorney, Agent, or Firm* — Greer, Burns & Crain, Ltd.

(57) ABSTRACT

An error correction encoding method is provided for encoding source digital data having the form of a frame, wherein the data can be classified into a plurality of classes. The present encoding method includes the following steps:
  a first encoding step for encoding data to be encoded formed by the data of a first class, to obtain encoded data; and
  implementing the following step successively for at least one other class:
    mixing data of the other class and the data encoded or to be encoded from a preceding encoding step; and
    encoding data to be encoded formed by mixed data to obtain encoded data.
Related decoding methods, as well as encoding and decoding devices are also disclosed.

16 Claims, 5 Drawing Sheets

(51) Int. Cl.
*H03M 13/29* (2006.01)
*H03M 13/35* (2006.01)
*H03M 13/39* (2006.01)
*H03M 13/27* (2006.01)
*H03M 13/11* (2006.01)
*H03M 13/13* (2006.01)
*H03M 13/15* (2006.01)
*H03M 13/19* (2006.01)

(52) U.S. Cl.
CPC ........ H03M13/356 (2013.01); H03M 13/3905 (2013.01); H03M 13/6362 (2013.01); *H03M 13/1102* (2013.01); *H03M 13/1194* (2013.01); *H03M 13/132* (2013.01); *H03M 13/136* (2013.01); *H03M 13/152* (2013.01); *H03M 13/1505* (2013.01); *H03M 13/1515* (2013.01); *H03M 13/19* (2013.01); *H03M 13/27* (2013.01); *H03M 13/296* (2013.01); *H03M 13/2963* (2013.01)

(56) References Cited

OTHER PUBLICATIONS

Sergio Benedetto et al., "Soft-Input Soft-Output Modules for the Construction and Distributed Iterative Decoding of Code Networks", European Transactions on Telecommunications, vol. 9, No. 2, Mar. 1, 1998, pp. 155-172.

Ralph Jordan et al., "Woven Convolutional Codes and Unequal Error Protection", ISIT, Washington, D.C. Jun. 24-29, 2001, p. 299.

Du Peng et al., "Woven Convolutional Codes and a New Iterative Decoding Algorithm", IEEE International Symposium on Personal, Indoor and Mobile Radio Communication Proceedings, 2003, pp. 1873-1875.

* cited by examiner

ERROR CORRECTION ENCODING METHOD, DECODING METHOD AND ASSOCIATED DEVICES

TECHNICAL FIELD

The present invention relates to an error correction encoding method.

It also relates to a decoding method adapted to decode data that have been encoded using the error correction encoding method according to the invention.

It also relates to an encoding device for implementing the error correction encoding method according to the invention, as well as a decoding device for implementing the decoding method according to the invention.

The field of the invention is that of encoding digital data, for being transmitted in particular in the presence of a transmission noise, and of decoding said digital data after transmission.

The invention more particularly but in a non-limiting way relates to the field of optimization of digital data transmission, for example via a wide band radio network.

BACKGROUND

In telecommunications, error correction encoding methods (also called Forward Error Correction (FEC)) are used to protect so-called source data to be transmitted, from errors that will come from the transmission. To do this, redundancy is added to the source data in order to enable the recipient to detect and correct part of the errors.

The error correction encoding is followed with a modulation for transmission, that is why generally, the modulation and coding scheme (MCS) is used to designate both the error correction encoding and the modulation.

In prior art is known an error correction encoding method commonly called "turbo code". This is an error correction encoding method, implementing in parallel at least two independent steps of systematic convolutive encoding of all the data to be encoded, and at least one time interleaving step changing the order for taking into account data for each of the encoding steps. Turbo codes are for example presented in French patent FR2675971. The decoding implements an iterative decoding algorithm based on the Bahl, Cocke, Jelinek and Raviv algorithm and an a posteriori maximum search.

One drawback of turbo codes however is that all the source data are equally protected.

UEP (Unequal Error Protection) codes, born with GSM technology, bring a response to this drawback by enabling digital data of a frame to be gathered into different classes depending on their importance, and each class to be protected depending on its priority level (a priority level all higher is assigned as the datum is important).

This principle enables transmission resources as well as the frequency band width used to be optimized.

A known drawback of UEP codes is that each class is separately processed. The different classes are first separated, and then separately encoded. The encoded data of each class are then separately modulated. After transmission, the data of a same frame are thus decorrelated. This involves a resource loss because there is for example a need for:
- further headers (that is further data used for defining a data packet, for example the data of a class in the case where the different classes are independently processed), and
- further processings to resynchronize the data from different classes of a same frame after transmission.

Further, this resynchronization steps generate reception delays.

Such a resource loss goes against the current demand for a higher transmission rate, higher network capacity and shorter transmission delay.

SUMMARY

One purpose of the present invention is to provide error correction encoding/decoding methods and devices which do not have the drawbacks of prior art.

Another purpose of the present invention is to provide error correction encoding/decoding methods and devices which minimize the transmission and reception delays, in particular for applications such as sound or video transmission.

Another purpose of the present invention is to provide error correction encoding/decoding methods and devices which are less resource-heavy than the methods and devices of prior art.

Another purpose of the present invention is to provide error correction encoding/decoding methods and devices which require fewer transmission rates than the methods and devices of prior art.

Finally, one purpose of the present invention is to provide error correction encoding/decoding methods and devices which require less network capacity than the methods and devices of prior art.

The invention enables at least one of these purposes to be achieved by an error correction encoding method for encoding so-called source digital data having the form of a frame, wherein said data can be classified into a plurality of classes.

The encoding method according to the invention comprises the following steps:
- a first encoding step for encoding data to be encoded, formed by the data of a first class, to obtain encoded data; and
- implementing the following steps, successively for at least one other class:
  - mixing the data of said other class with data encoded or to be encoded from a preceding encoding step; and
  - encoding data to be encoded formed by said mixed data, to obtain encoded data.

Said mixed data are the data resulting from the mixing of the data of said other class with the data to be encoded from a preceding encoding step.

Each step of mixing data can consist for example in an interleaving or a simple concatenation. An interleaving can consist in organizing received data non-contiguously. Any type of known interleaving can be considered, in particular interleavings developed within the scope of turbo codes.

Generally, errors during a transmission on a channel occur as bursts rather than independently. If the number of errors exceeds the capacity of the error correction encoding, it fails to recover the source data. The interleaving is generally used to aid in solving this problem by changing the order for taking into account same digital data in several encodings, thus creating a more uniform error distribution.

The invention advantageously provides adding new information to be encoded before each encoding step.

Several steps of encoding the same data can also be provided before adding new information to be encoded.

At least one intermediate step can be provided, before a step of mixing data of said other class with data encoded or to be encoded from a preceding encoding step, consisting in implementing:
- mixing data encoded or to be encoded from the preceding encoding step; and
- encoding data to be encoded formed by said mixed data.

A UEP type error correction encoding method therefore is performed, that is with a non-uniform protection, wherein each class can benefit from a different protection as to errors occurring in particular during the transmission on a channel.

This different protection comes from a different number of redundancy information, as a function of the number of times the data of the class have been encoded.

Each class can indeed be encoded a different number of times, according to a number of encodings performed taking into account the data of this class. The data of the class can be taken into account for an encoding, as data of a first class, as data of said other class and/or as data to be encoded or encoded during a preceding encoding step.

The method according to the invention is adapted to process entire frames.

The data protection can be called hierarchical, wherein more important data, in other words with a higher priority level, can be better protected.

The structure can be adapted to any frame type, regardless in particular of the number of classes.

A UEP encoding is performed which is directly applicable to an entire frame of digital data.

Each class of a frame can thus be encoded with a dedicated encoding scheme different from the encoding scheme applied to one or more other classes of the same frame.

The method according to the invention thus enables an encoding to be performed with fewer resources than state of the art methods.

Besides, the method according to the invention enables a quicker encoding to be performed by consuming less power than state of the art methods.

Finally, data encoded with the method according to the invention can be transmitted with fewer transmission rates and less network capacity than data encoded with prior art methods and devices, with an equal protection.

The method according to the invention enables the capacity of a channel for transmitting source digital data and/or the geographical coverage of so-called source digital data to be increased.

The method according to the invention enables the different classes of a same frame to be encoded by a single error correction encoding method, unlike known UEP encoding methods wherein each class is encoded independently from the other classes of the same frame.

It is no longer necessary to separate data of different classes of a same frame into several data flows, to encode them separately.

The method according to the invention thus enables the transmission of synchronization information to be avoided, and thus the resources of the transmission network to be optimized.

The method according to the invention thus enables a reception delay to be reduced, in particular for applications such as sound (for example voice) or video transmission.

The method according to the invention thus enables a resynchronization step to be avoided after transmission.

The method according to the invention thus enables the modulation of data that have been encoded to be simplified, wherein all the classes of a frame can be modulated together. It enables a single modulation scheme to be applied.

The invention takes up the general principle of turbo codes, since there are successive encoding steps and mixing steps in view of a further encoding of the same data. However, the known scheme has been changed to result in an encoding scheme wherein different source digital data of a same frame are more or less protected.

The at least one mixing step can provide a random distribution of the digital data in the final result.

The digital data can be any digital datum, in particular digital data representing a video or a voice.

The encoding method is preferably followed by a suitable modulation adapted to the transmission channel used.

The encoding and modulation scheme that can then be obtained is particularly robust to errors.

Some data of the frame can be provided not to be encoded.

Preferably, a priority level is assigned to each of the classes, wherein encoding steps are performed for classes in the decreasing order of the priority levels.

The method according to the invention thus enables each class to benefit from an adapted protection.

Thereby, it enables the transmission of more redundancy information than necessary to be avoided, which enables the resources of the transmission network to be optimized while obtaining an optimum reception quality, since the most important information have been highly protected.

The steps of:
mixing the data of said other class with data encoded or to be encoded of a preceding encoding step; and
encoding the data to be encoded formed by said mixed data, to obtain encoded data,
can be implemented for all the other classes of the frame.

Thus, all the source digital data can be protected.

According to an advantageous embodiment, the encoding method according to the invention is called "in series", and the data of said other class are mixed with encoded data from a preceding encoding step.

According to another advantageous embodiment, the encoding method according to the invention is said "in parallel", and data of said other class are mixed with data to be encoded from a preceding encoding step.

Each of both so-called "in series" or "in parallel" embodiments have different redundancies and complexities and their respective use depends on the nature of the transmission system.

Advantageously, at least one of the encoding step implements a recursive systematic convolutional code.

It is the conventionally implemented code type in turbo codes. This type of code has good performances to protect the data to be transmitted by calculating the redundancy data.

According to the invention at least one of the encoding steps can implement any digital encoding.

In particular, at least one of the encoding steps can implement at least one code among:
a BCH code;
a block code;
a concatenated convolutional code;
a constant-weight code;
a convolutional code;
a fountain code;
a group code;
a Golay code;
a Goppa code;
a Hadamard code;
a Hagelbarger code;
a Hamming code;
a low-density parity-check code called LDPC code;
a Luby transform code called LT code;
a parallel concatenated block code called PCBC code;
a raptor code;
a recursive non-systematic convolutional code;
a Reed-Solomon code;
a Reed-Müller code;
a repeat-accumulate code;

a repeat code;
a Tornado code;
a turbo code;
a parallel or series multiple turbo code;
a Walsh-Hadamard code;
a Woven code; and
a zigzag code.

This is a non-exhausted list of known codes, used in the field of data transmission to protect source digital data to be transmitted.

Each encoding step can implement a different code.

An implementation of the puncturing can be provided following the implementation of a coding step. This can involve at least one depuncturing step during a decoding. The depuncturing consists in retrieving data of the same size as the data before a corresponding puncturing, for example by introducing zeros in the punctured data.

The invention also relates to an encoding device for implementing the error correction encoding method according to the invention, able to encode so-called source digital data having the form of a frame, wherein said data can be classified into a plurality of classes. The encoding device according to the invention comprises:
 a first encoding module arranged to encode data to be encoded formed by the data of a first class, and obtaining encoded data;
 at least one set, each set being associated with one other class and comprising:
  a mixer, arranged to mix the data of said other class and the data encoded or to be encoded by a preceding encoding module, and
  an encoding module, arranged to encode data to be encoded formed by the output of the corresponding mixer and to obtain encoded data.

The invention also relates to a method for decoding digital data, arranged to decode digital data encoded in accordance with the encoding method according to the invention.

Preferably, the source digital data, encoded in accordance with the method according to the invention, are transmitted via a transmission channel.

So-called received data that may be affected by errors occurring in particular during the transmission can therefore be received after transmission.

Advantageously, the decoding method according to the invention is applied to such received data.

For reasons of clarity of the description, a datum before and after transmission is designated in the same way throughout the text.

According to an advantageous alternative, the decoding method according to the invention comprises the following steps:
 for one of the classes, a first decoding step performing the following operations:
  decoding encoded data of said class,
  providing at least one so-called extrinsic datum, provided to be used as an a priori datum for at least one decoding of the data of an other class;
  providing at least one so-called "soft" datum, for assessing the data of the class,
 a decoding step for at least one other encoded class, performing the following operations:
  decoding the encoded data of said other class, as a function of at least one extrinsic datum provided by at least one other decoding step, used as an a priori datum,
  providing at least one extrinsic datum,
  providing at least one "soft" datum for assessing said other class.

According to a first alternative of the decoding method according to the invention, this is adapted to a so-called "in series" encoding.

In this case, the at least one provided extrinsic datum to be used as an a priori datum for a step of decoding data of another class can comprise information relating to the encoded data.

According to a second alternative of the decoding method according to the invention, the method is adapted to a so-called "in parallel" encoding.

In this case, the method according to the invention further comprises an initial demultiplexing step performing the separation of encoded data of each class.

The encoded data of each class can then each be used for a corresponding decoding step.

The encoded data of a class preferably correspond to the encoded data obtained during the first encoding of the data of said class.

A first encoding is mentioned since data of a class can be encoded several times, a first time as a datum of a class, another time as a datum to be encoded or encoded from a preceding encoding step.

Each decoding step can implement an iterative decoding, that is any type of algorithm based on the maximum a posteriori (MAP) search for assessing a posteriori probabilities. This maximum a posteriori can be calculated with the BCJR algorithm (Bahl, Cocke, Jelinek and Raviv algorithm), with a MAP derivation, in particular according to a so-called LOG MAP decoding using a likelihood ratio ("Log Likelihood Probabilities Ratios"), or a so-called MAX LOG MAP decoding, more suitable for the hardware implementation.

Before their use as an a priori datum for a decoding step, extrinsic data can be processed before using at least some of them as a priori data.

The aim is to retrieve data of the same dimension and in the same order as the data at the output of the corresponding encoding step.

The so-called "a priori" data preferably represent probabilities on encoded data received from the channel.

These probabilities are available before any current decoding of said received encoded data, these probabilistic values coming from a source different from the encoded data received from the channel.

The extrinsic data of a bit B advantageously designate the information produced by a decoder (based on the encoded information received from the channel and, if applicable, the a priori data), except for the channel and a priori information of the bit B concerned.

These extrinsic data can represent the probability that this bit B was received as a function of the values of all the other adjacent bits of the same frame.

The extrinsic data preferably comprise so-called "a priori" data providing a further datum for assessing data from other classes.

The following book could in particular be referred to: Todd K Moon, "Error Correction Coding—Mathematical Methods and Algorithms", John Wiley & Sons 2005.

Each class can benefit from a different protection with respect to errors. A strongly protected class will benefit from an error rate all the less important during decoding.

A decoding of encoded data of said other class, as a function of at least one extrinsic datum provided by another decoding step, used as an a priori datum, enables the different encoded classes to benefit from the encoding of the other encoded classes.

A given bit error rate can thus be more quickly reached, for a less protected class. The invention thereby allows energy, redundancy and delay savings.

Each decoding step enables the data of a class to be assessed.

Preferably, the assessments of data of each class are gradually extracted from the soft data.

A specific step for assessing the soft data can further be provided to retrieve the values of the corresponding class.

Advantageously, a decoding step is successively performed for all the classes.

The first decoding step can be performed for the latest class that has been encoded, and the following decoding steps can be performed for the classes considered in the reverse order of that in which they have been encoded.

Non contradictorily, a decoding step can be non successively performed for any class, regardless of the encoding order.

The first encoding step can be performed for an intermediate class, and the preceding and following decoding steps can be performed in any advantageous order, in particular according to a preset error rate to be achieved for each class.

At least one decoding step can be reiterated at least once, as a function of a priori data corresponding to extrinsic data provided by at least one step for decoding data of another class.

Extrinsic data coming from the decoding of several other classes can thus be used.

Each of the decoding steps can be reiterated at least once, as a function of the extrinsic data provided by the step(s) of decoding data of any other class that has been encoded.

Before their use for reiterating a decoding step, extrinsic data can be processed before using at least some of them as a priori data. The aim is to retrieve data of the same dimension and in the same order as the data at the output of the corresponding encoding step.

Thus reiterated decoding step can then be followed by new steps for decoding data from following or preceding classes.

At least one feedback is thus performed. The decoding method according to the invention can thus be considered as iterative, wherein each new iteration of a decoding step can improve the assessment of the data of the corresponding class.

Information from other classes can thus be used to improve the decoding of a class.

Each class benefits from a different protection with respect to errors. A strongly protected class will benefit from an error rate all the less important during decoding. During decoding, the at least one feedback enables to exploit the fact that during encoding, data corresponding to each of the classes are mixed. The different encoded classes can thereby benefit from the encoding of the other encoded classes.

A given bit error rate can thus be more quickly reached, for a less protected class. The invention thereby allows energy, redundancy and delay savings.

According to a preferred embodiment, all the decoding steps corresponding to each of the classes (their first iteration) make up a decoding phase, the decoding method according to the invention comprising an iteration of said decoding phase at least twice, and from the second iteration, the decoding step of the data of the latest class that has been encoded can be performed as a function of a priori data corresponding to extrinsic data provided by the decoding step of the data of the first class that has been encoded.

Information from all the other classes can thus be used to improve the decoding of a class.

The invention also relates to a decoding device adapted to implement the decoding method according to the invention.

The decoding device according to the invention can comprise:

a first decoding module arranged to decode the encoded data of a class, to provide at least one so-called extrinsic datum to at least one other decoding module, and to provide at least one so-called "soft" datum for assessing said class;

for each of the other classes, a decoding module arranged to receive as an a priori datum at least one extrinsic datum provided by at least one another decoding module, to decode the encoded data of said other class, and to provide at least one so-called extrinsic datum, and at least one so-called "soft" datum for assessing said other class.

The invention finds an application in all the fields of data transmission and any transmission system, whether it is a wire or a wireless transmission. It can be in particular the field of:

terrestrial radio communications,
aerospace radio communications,
data transmission in robotics or electronics,
audio and/or video applications.

The invention also relates to a computer program product comprising instructions to perform the steps of the encoding method according to the invention when run on a computer device.

The invention also relates to a computer program product comprising instructions to perform the steps of the decoding method according to the invention when run on a computer device.

BRIEF DESCRIPTION OF THE DRAWINGS

Further advantages and features of the invention will appear upon reading the detailed description of the implementations and embodiments in no way limiting, and of the following appended drawings wherein.

DETAILED DESCRIPTION

Throughout the text, a multiplexing can designate a concatenation, an interleaving or any other operation performed to rank data in a one-dimensional or multidimensional frame.

Throughout the text, when demultiplexing is mentioned to, it refers to a given multiplexing, the demultiplexing being the reverse operation of said multiplexing.

Throughout the text, when deinterleaving is mentioned to, it refers to a given interleaving, the deinterleaving consisting in retrieving the order of data before said interleaving.

The means for implementing each step of the method according to the invention are known to those skilled in the art, consequently only exemplary methods according to the invention will be described in detail.

Figure 1:
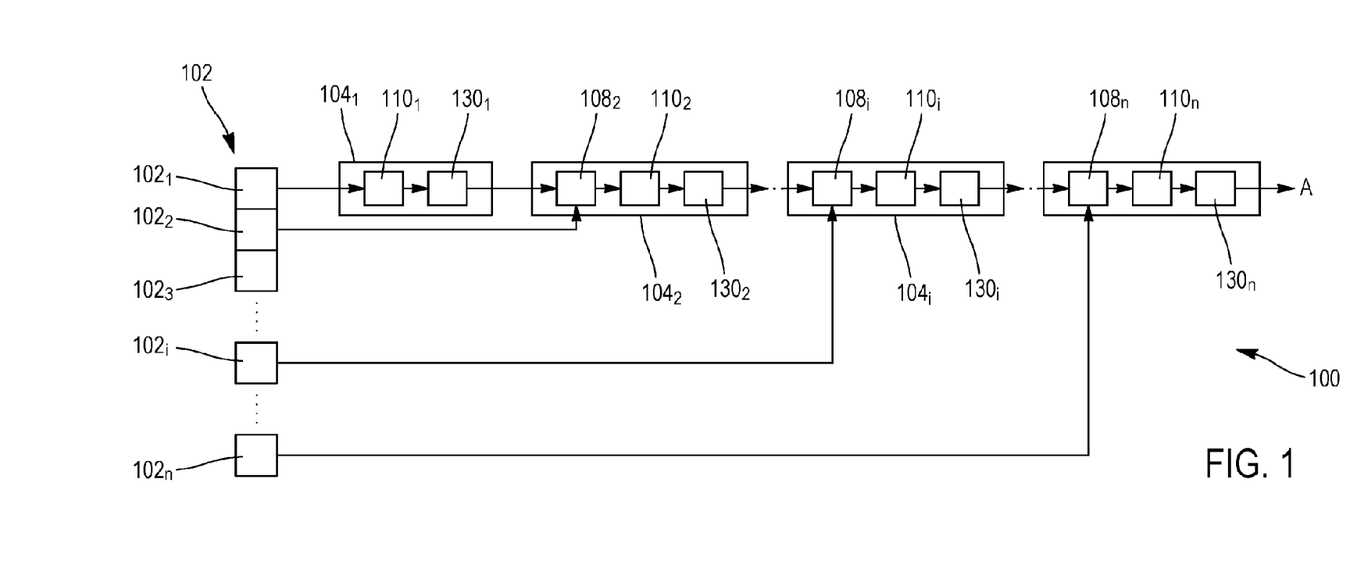
FIG. 1 diagrammatically illustrates a so-called "in series" example of the encoding method according to the invention, FIG. 2 diagrammatically illustrates a so-called "in series" example of the decoding method according to the invention, FIG. 3 diagrammatically illustrates a so-called "in parallel" example of the encoding method according to the invention, FIG. 4 diagrammatically illustrates a so-called "in parallel" example of the decoding method according to the invention.

FIG. 1 is a diagram representation of an example of a so-called "in series" encoding method, in accordance with the method according to the invention.

FIG. 1 gives details of a particular case where a puncturing is further performed after each encoding step.

In the example represented in FIG. 1, a data frame 102 is encoded. The data of the frame 102 are classified in n classes $102_1$-$102_n$. Each of the classes 102, is associated with a priority level. In the present example, in a non-limiting way, the priority level of the class $102_1$ is greater than the priority level of the class $102_2$, and so on, the class with the lowest priority level being the class $102_n$.

The method 100 comprises a first coding step $104_1$ which comprises:
    an encoding $110_1$ of the data of the class $102_1$;
    a puncturing $130_1$ of the data encoded during encoding $110_1$.

This step $104_1$ is followed by a second coding step $104_2$ performing:
    an interleaving $108_2$ of the data punctured at the puncturing $130_1$ with the data of the class $102_2$;
    an encoding $110_2$ of the interleaved data provided by the interleaving $108_2$, and
    a puncturing $130_2$ of the data encoded during the encoding $110_2$.

The method 100 comprises after the step $104_2$, a coding step $104_3$ and so on up to the step $104_n$. Each of the steps $104_i$ for i≥3 comprises the following operations:
    an interleaving $108_i$ of the data punctured at the puncturing $130_{i-1}$ with the data of the class $102_i$;
    an encoding $110_i$ of the interleaved data provided by the interleaving $108_i$, and
    a puncturing $130_i$ of the data encoded during the encoding $110_i$.

The encoded data A are obtained in output.

The data of the frame 102 are modulated and transmitted together as the data A, because they are not separated prior to the implementation of the encoding method according to the invention.

The data A are preferably modulated and then transmitted on a transmission channel.

After transmission, the data A that can be affected by errors are received.

Figure 2:
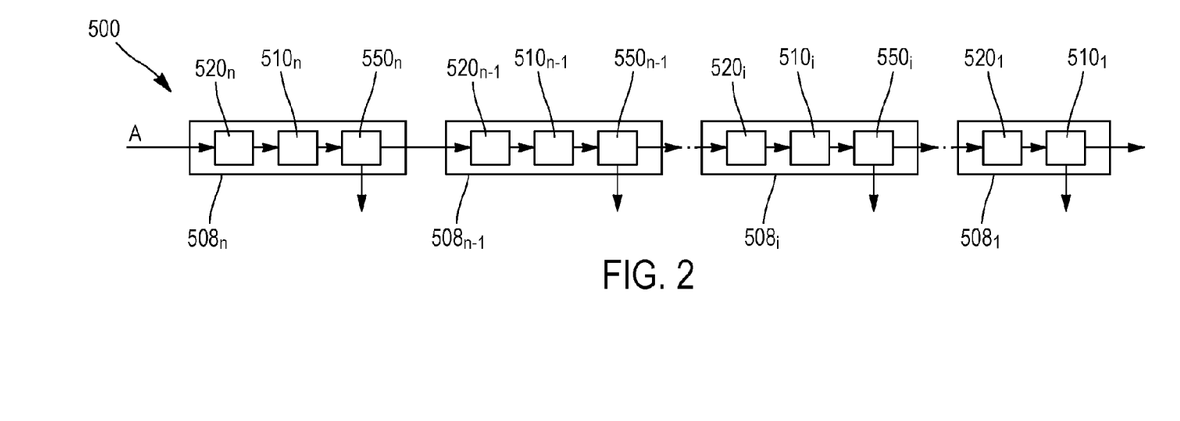

FIG. 2 is a diagram representation of an example of a "in series" decoding method 500 in accordance with the method according to the invention represented in FIG. 1.

In the example represented in FIG. 2, data A are decoded.

A first decoding step $508_n$ of the data of the class $102_n$ comprises the following steps:
    a depuncturing $520_n$ of the data punctured during the puncturing $130_n$ (each depuncturing $520_i$ consisting in retrieving data of the size of those obtained before the puncturing $130_i$),
    a decoding $510_n$ of the encoded data of the class $102_n$, using the depunctured data, and providing so-called extrinsic data and so-called "soft" data
    a deinterleaving $550_n$ on the one hand of the soft data, to provide an assessment of the data of the class $102_n$, and on the other hand of the useful extrinsic data at least some of which are used as an a priori datum at the following decoding step.

The deinterleaving $550_n$ is followed by a new decoding step $508_{n-1}$ of the data of the class $102_{n-1}$. The method 500 comprises after step $508_{n-1}$ a decoding step $508_{n-2}$ and so on up to the step $508_2$. Each step $508_i$ for n−1≥i≥2 comprises the following operations:
    a depuncturing $520_i$ (reverse of the puncturing $130_i$), of the useful extrinsic data obtained during the preceding deinterleaving,
    a decoding $510_i$ of the encoded data of the class $102_i$, using as an a priori datum useful extrinsic data obtained during the preceding decoding step, and providing extrinsic data and soft data,
    a deinterleaving $550_i$ on the one hand of the soft data, to provide an assessment of the data of the class $102_i$, and on the other hand of the useful extrinsic data at least some of which are used as an a priori datum at the following decoding step.

A last decoding step $508_1$ comprises:
    a depuncturing $520_1$ (reverse of the puncturing $130_1$), of the useful extrinsic data obtained in the preceding deinterleaving,
    a decoding $510_1$ of the encoded data of the class $102_1$, using as an a priori datum useful extrinsic data obtained in the preceding decoding step, and providing extrinsic and soft data.

The decoding method 500 represented in FIG. 2 also comprises a feedback not represented, which consists in using extrinsic data provided at a decoding step to reiterate another decoding step.

The extrinsic data used for a reiteration of a decoding step can be interleaved to retrieve data of the same dimension and in the same order as the data at the output from the corresponding encoding step.

Figure 3:
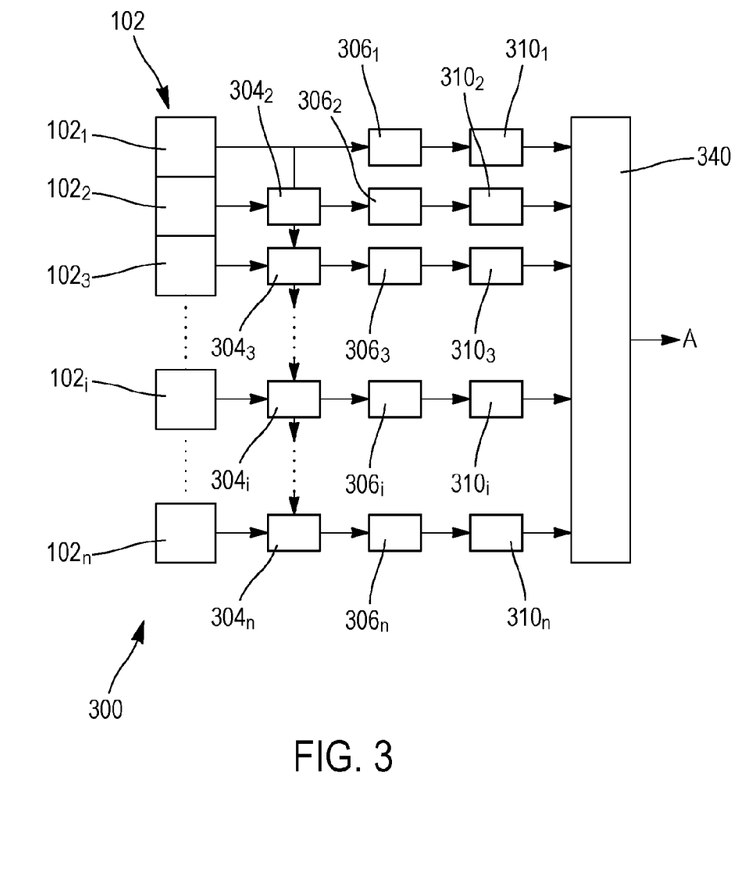

FIG. 3 is a diagram representation of an example of a so-called "parallel" encoding method in accordance with the method according to the invention.

FIG. 3 gives details of the particular case where a puncturing is further performed after each encoding step.

In the example represented in FIG. 3, a frame of data 102 is encoded. Data of the frame 102 are classified into n classes $102_1$-$102_n$. Each of the classes 102, is associated with a priority level. In the present example, in a non-limiting way, the priority level of the class $102_1$ is greater than the priority level of the class $102_2$, and so on, the class with the lowest priority level being the class $102_n$.

The method 300, represented in FIG. 3, comprises a first coding step which is limited to the encoding $306_1$ of the data of the class $102_1$ and then to the puncturing $310_1$ of the encoded data.

This step is followed by a second coding step performing (in the same time, after or even before the encoding $306_1$):
    an interleaving $304_2$ of data of the class $102_1$ with the data of the class $102_2$;
    an encoding $306_2$ of the interleaved data provided by the interleaving $304_2$;
    a puncturing $310_2$ of the encoded data obtained.

The method 300 also comprises a third coding step and so on up to the step n. Each of the steps i for i≥3 comprises the following operations:
    an interleaving $304_i$ of the data of the class $102_i$ with the data interleaved by the interleaving $304_{i-1}$;
    an encoding $306_i$ of the interleaved data provided by the interleaving $304_i$;
    a puncturing $310_i$ of the encoded data obtained.

In output, the encoded frame A is obtained by a multiplexing 340 of the punctured encoded data provided at each puncturing.

The data of the frame 102 are modulated and transmitted together as data A, because they are not separated prior to the implementation of an encoding method according to the invention.

Data A are preferably modulated and then transmitted on a transmission channel.

After transmission, data A which can be affected by errors are received.

Figure 4:
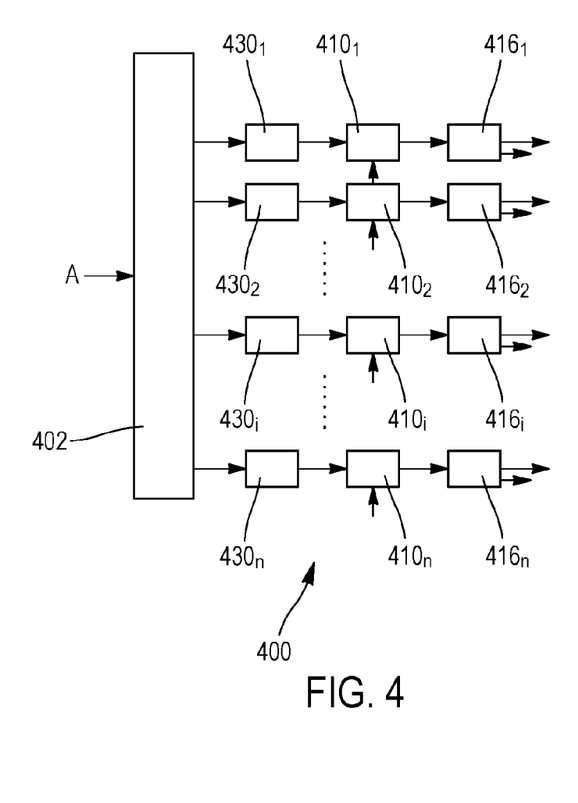

FIG. 4 is a diagram representation of an example of a parallel decoding method 400 in accordance with the method according to the invention represented in FIG. 3.

In the example represented in FIG. 4, data A are decoded. These data A have been encoded in accordance with the parallel encoding method 300 according to the invention.

The method 400 comprises a preliminary demultiplexing step 402 allowing the encoded data respectively obtained in the puncturing steps $310_{1 \to n}$ of the parallel encoding method 300 to be separated among data A.

Each step of decoding the data of the class $102_i$ comprises the following steps, i ranging from 1 to n:
- a depuncturing $430_i$ of the encoded data punctured in the puncturing step $310_i$;
- a decoding $410_i$ of the depunctured data, as a function of a priori datum, which is zero if data from other decoding steps are not usable (case of the decoding $410_i$ performed first in the chronological order, and for which a priori data coming from a preceding decoding step are not yet available);
- a deinterleaving $416_i$ implementing an interleaving function being reverse of the interleaving function implemented in the interleaving $304_i$ of the parallel encoding method 300, enabling to isolate an assessment of the data of the class $102_i$, corresponding to soft data, and data at least some of which can be used as an a priori datum in another decoding step, corresponding to extrinsic data.

The decoding method 400 adapted to the parallel encoding also comprises at least one feedback not represented, which consists in using extrinsic data provided by a decoding step to reiterate another decoding step.

The extrinsic data used for a reiteration of a decoding step can be interleaved to retrieve so-called a priori data, of the same dimension and in the same order as the data at the output from the corresponding encoding step.

Figure 5:
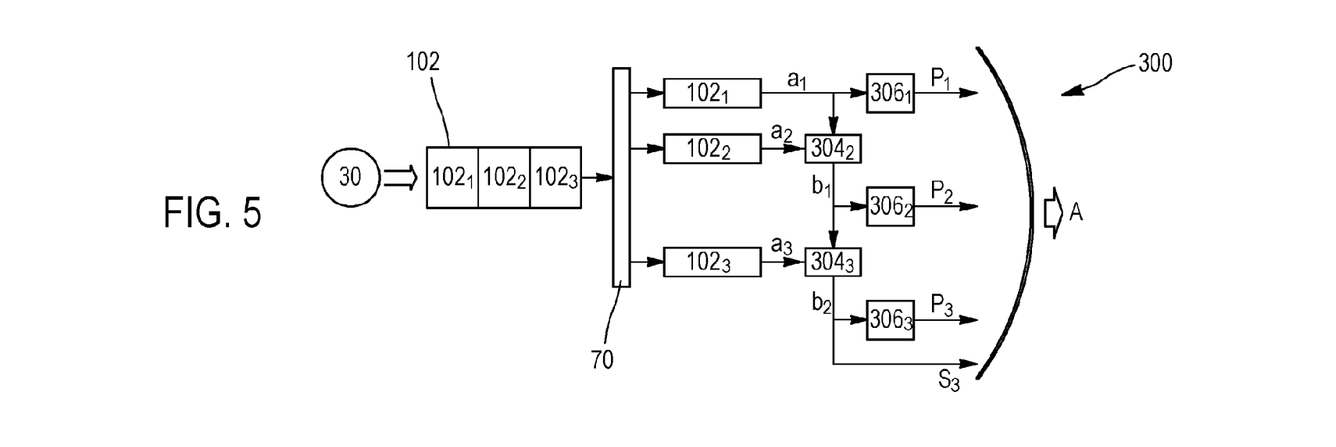
FIG. 5 illustrates a particular embodiment of the so-called "in parallel" encoding method according to the invention.

A particular embodiment of the so-called "parallel" encoding method 300 according to the invention will now be described referring to FIG. 5, in the case where each encoder implements a recursive systematic convolutional code.

Such a code enables encoded data formed by so-called "parity" data (redundancy) and so-called "systematic" data (identical to the data to be encoded) to be obtained.

Throughout the text, the systematic data and parity data can comprise tail bits.

The so-called source digital data 30 are formed by a frame 102 comprising three classes $102_1$, $102_2$ and $102_3$.

The method 300 according to the invention comprises an initial step 70 of separating the data of each of the classes $102_1$, $102_2$ and $102_3$.

The data of the class $102_1$ are designated by the symbol $a_1$.
The data of the class $102_2$ are designated by the symbol $a_2$.
The data of the class $102_3$ are designated by the symbol $a_3$.

The method 300 according to the invention comprises a first encoding step $306_1$ of the data of the class $102_1$.

The parity data $P_1$, that is the redundancy data relating to the data $a_1$ are obtained. The obtained data $P_1$ are called "parity of the class $102_1$".

The method 300 according to the invention then (or simultaneously) comprises a step $304_2$ of interleaving the data $a_1$ with the data $a_2$ of the class $102_2$.

Interleaved data $b_1$ are obtained.

The interleaved data $b_1$ are then encoded during an encoding step $306_2$, which provides parity data $P_2$, that is redundancy data relating to the data $b_1$.

Since data $b_1$ are formed by the mixed data $a_1$ and $a_2$, the number of available redundancy data corresponding to data $a_1$ is increased.

The obtained data $P_2$ are called "parity of the classes $102_1$ and $102_2$".

The method 300 according to the invention then (or simultaneously) comprises a step $304_3$ of interleaving the data $b_1$ with the data $a_3$ of the class $102_3$.

Interleaved data $b_2$ are obtained.

The interleaved data $b_2$ are then encoded during an encoding step $306_3$, which provides parity data $P_3$, that is redundancy data relating to the data $b_2$.

Since data $b_2$ are formed by the mixed data $a_1$, $a_2$ and $a_3$, the number of available redundancy data corresponding to data $a_1$ and $a_2$ is increased.

The obtained data $P_3$ are called "parity of the classes $102_1$, $102_2$ and $102_3$".

Data A gathering all the parities $P_1$, $P_2$ and $P_3$ are obtained in output, as well as a so-called systematic output $S_3$ corresponding to the data $b_2$ to be encoded during the last encoding step $306_3$. The systematic output is due to the use of recursive systematic convolutional codes.

Figure 6:
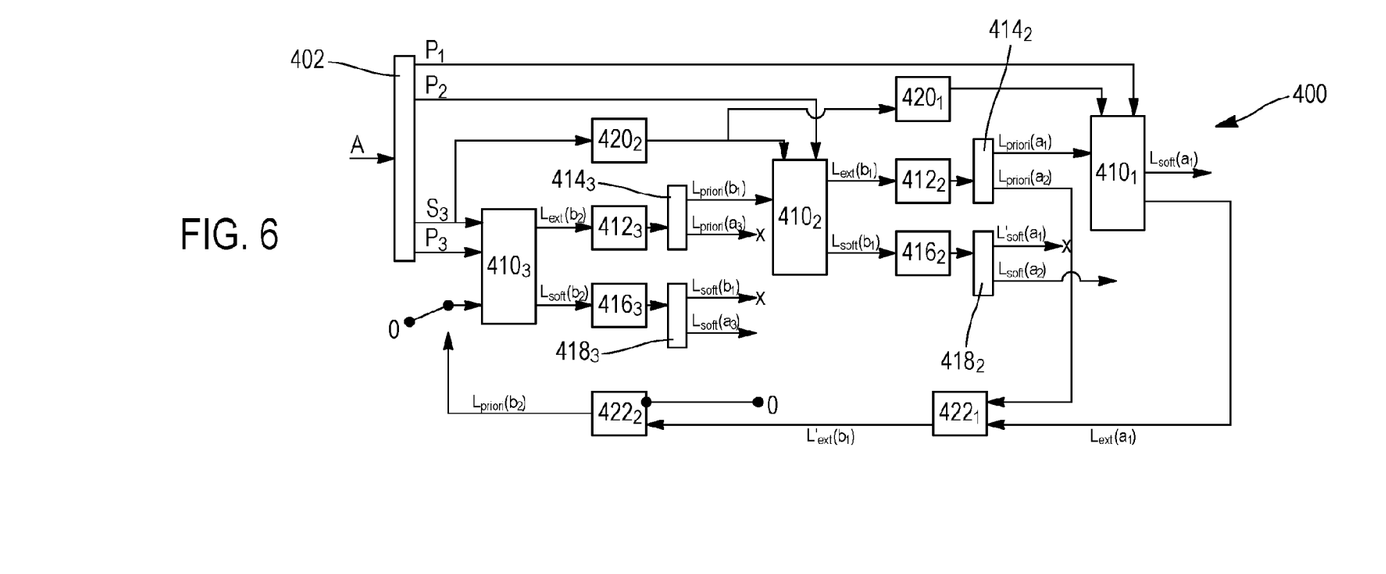
FIG. 6 illustrates a particular embodiment of the so-called "in parallel" decoding method according to the invention.

A particular embodiment of the so-called "parallel" decoding method 400 according to the invention, corresponding to the encoding method of FIG. 5, will now be described in reference to FIG. 6, and in the case where each encoder implements a recursive systematic convolutional code.

A first demultiplexing step 402 enables the parities $P_1$, $P_2$, $P_3$ and the systematic output $S_3$ to be separated among the received data A.

The method 400 according to the invention comprises a first decoding comprising a decoding step $410_3$ of the parity $P_3$, as a function of the systematic output $S_3$ and an a priori datum initially set to zero.

An output $L_{soft}(b_2)$ and so-called extrinsic data $L_{ext}(b_2)$ are obtained.

The output $L_{soft}(b_2)$ enables data $b_2$ to be assessed.

Throughout the text, $L_{soft}$, $L_{ext}$ and $L_{priori}$ correspond to the logarithmic probabilities for each data bit to be 0 or 1, resulting from an advantageous use for this particular embodiment of the decoding algorithm called MAX LOG MAP.

On the one hand, the following steps are implemented:
- deinterleaving $416_3$ of the output $L_{soft}(b_2)$, the deinterleaving $416_3$ implementing a deinterleaving function reverse of the interleaving function implemented in the interleaving step $304_3$;
- demultiplexing $418_3$ to separate the $L_{soft}(a_3)$ and $L_{soft}(b_1)$ data.

The output $L_{soft}(a_3)$ corresponds to an assessment of the data $a_3$ of the class $102_3$.

The output $L_{soft}(b_1)$ corresponds to an assessment of the data $b_1$.

Indeed, the data $b_2$ correspond to the data $a_3$ interleaved with the data $b_1$.

So-called extrinsic data $L_{ext}(b_2)$ comprise in particular information relating to an assessment of the data of the class $102_3$.

On the other hand, the following steps are implemented:

deinterleaving $412_3$ of the output $L_{ext}(b_2)$, the deinterleaving $412_3$ implementing a deinterleaving function reverse of the interleaving function implemented in the interleaving step $304_3$;

demultiplexing $414_3$ to separate the $L_{priori}(a_3)$ and $L_{priori}(b_1)$ data.

The $L_{priori}(a_3)$ data correspond to the logarithmic probabilities for each data bit of the class $102_3$ to be 0 or 1.

The $L_{priori}(b_1)$ data are used as a priori information at the following decoding step.

The demultiplexing $414_3$ is followed by a second decoding comprising a decoding step $410_2$ of the parity $P_2$, as a function of $L_{priori}(b_1)$ and the systematic output $S_3$ at which a deinterleaving $420_2$ has been applied implementing a deinterleaving function reverse of the interleaving function implemented in the interleaving step $304_3$, and a demultiplexing to separate systematic information corresponding to the data $b_1$ and the data of the class $a_3$. Only the systematic data $b_1$ are useful for this decoding.

An output $L_{soft}(b_1)$ and so-called extrinsic data $L_{ext}(b_1)$ are obtained.

The output $L_{soft}(b_1)$ enables data $b_1$ to be assessed.

On the one hand, the following steps are implemented:

deinterleaving $416_2$ of the output $L_{soft}(b_1)$, the deinterleaving $416_2$ implementing a deinterleaving function reverse of the interleaving function implemented in the interleaving step $304_2$;

demultiplexing $418_2$ to separate the $L_{soft}(a_2)$ and $L'_{soft}(a_1)$ data.

The output $L_{soft}(a_2)$ corresponds to an assessment of the data $a_2$ of the class $102_2$.

The so-called extrinsic data $L_{ext}(b_1)$ comprise information relating to an assessment of the data of the classes $102_1$ and $102_2$.

On the other hand, the following steps are implemented:

deinterleaving $412_2$ of the output $L_{ext}(b_1)$, the deinterleaving $412_2$ implementing a deinterleaving function reverse of the interleaving function implemented in the interleaving step $304_2$;

demultiplexing $414_2$ to separate the $L_{priori}(a_2)$ and $L_{priori}(a_1)$ data.

The $L_{priori}(a_2)$ data correspond to the probabilities for each data bit of the class $102_2$ to be 0 or 1.

The $L_{priori}(a_1)$ data are used as a priori information in the following decoding step.

The demultiplexing $414_2$ is followed by a third decoding comprising a decoding step $410_1$ of the parity $P_1$, as a function of $L_{priori}(a_1)$ and the systematic output $S_3$ at which a deinterleaving $420_2$ and then $420_1$ has been applied, implementing a deinterleaving function reverse of the interleaving function implemented in the interleaving step $304_3$ respectively $304_2$, and the demultiplexing suitable for obtaining the systematic data of the class $a_1$.

The extrinsic data $L_{ext}(a_1)$ and an assessment $L_{soft}(a_1)$ of the data of the class $102_1$ are obtained.

The decoding method 400 has a feedback comprising the following steps:

interleaving $422_1$ of the $L_{ext}(a_1)$ and $L_{priori}(a_2)$ data, to obtain an interleaved datum $L'_{ext}(b_1)$, and implementing an interleaving function similar to the interleaving function implemented in the interleaving $304_2$ of the parallel encoding method 300;

interleaving $422_2$ of the $L'_{ext}(b_1)$ and $L'_{ext}(a_3)$ data, to obtain an interleaved datum $L_{priori}(b_2)$, and implementing an interleaving function similar to the interleaving function implemented in the interleaving $304_3$ of the parallel encoding method 300 ($L'_{ext}(a_3)$ being a datum of the size of $a_3$ but assuming zero values);

new iteration of the decoding step $410_3$, taking into account an a priori datum $L_{priori}(b_2)$;

new iteration of the steps following the decoding step $410_3$.

This feedback enables each class to benefit from the decoding accuracy obtained for the other classes.

Finally, the classes not much protected can be decoded with a better accuracy than if they had been encoded separately from better protected classes.

Figure 7:
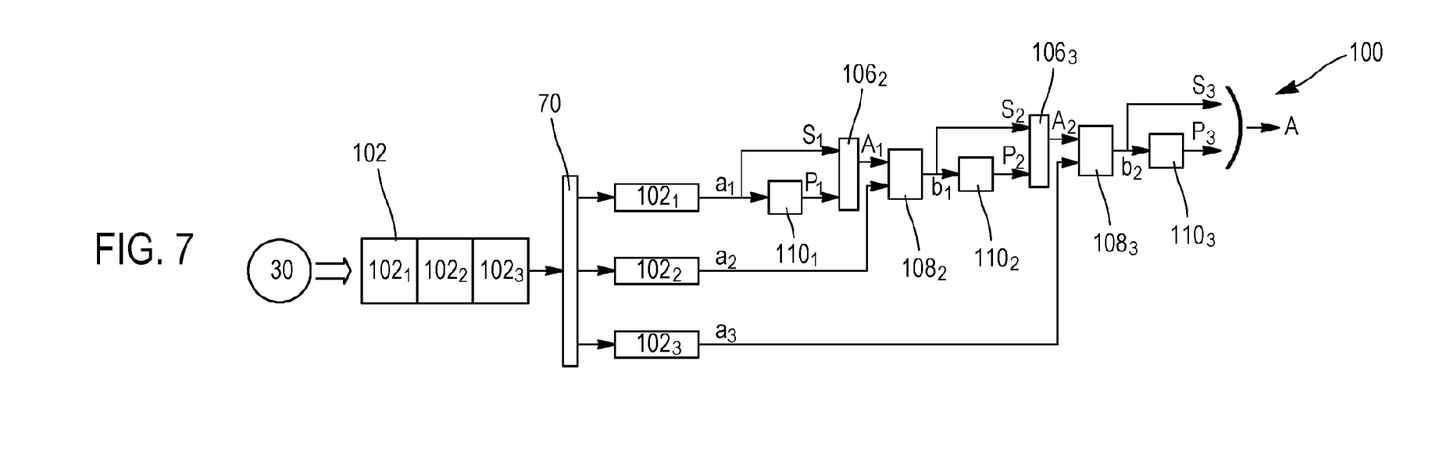
FIG. 7 illustrates a particular embodiment of the so-called "in series" encoding method according to the invention.

A so-called "series" embodiment of the error correction encoding method 100 according to the invention will now be described in reference to FIG. 7, in the case where each encoder implements a recursive systematic convolutional code.

The so-called source digital data 30 are formed by a frame 102 comprising three classes $102_1$, $102_2$ and $102_3$.

The method 100 according to the invention comprises an initial step 70 of separating the data of each of the classes $102_1$, $102_2$ and $102_3$.

The data of the class $102_1$ are designated by the symbol $a_1$.
The data of the class $102_2$ are designated by the symbol $a_2$.
The data of the class $102_3$ are designated by the symbol $a_3$.

The method 100 according to the invention comprises a first encoding step $110_1$ of the data of the class $102_1$.

Encoded data $P_1$ and $S_1$ are obtained.

The encoded data $P_1$ obtained are called "parity of the class $102_1$" and correspond to redundancy data enabling the data $a_1$ to be retrieved. The encoded data $S_1$ obtained are called "systematic of the class $102_1$".

The method 100 according to the invention then comprises:

a step $106_2$ of multiplexing the parity $P_1$ with the systematic output $S_1$, to obtain multiplexed data $A_1$; and then a step $108_2$ of interleaving the multiplexed data $A_1$ with the data $a_2$ of the class $102_2$.

Interleaved data $b_1$ are obtained.

The interleaved data $b_1$ are then encoded during an encoding step $110_2$, which provides encoded data $P_2$ and $S_2$.

The encoded data $P_2$ obtained are called "parity of $b_1$". These are redundancy data enabling the data $b_1$ to be retrieved. Since the data $b_1$ comprise the mixed data $a_1$ and $a_2$, the number of available redundancy data corresponding to the data $a_1$ is increased.

The encoded data $S_2$ obtained are called "systematic of $b_1$".

The method 100 according to the invention then comprises:

a step $106_3$ of multiplexing the parity $P_2$ with the systematic output $S_2$, to obtain multiplexed data $A_2$; and then a step $108_3$ of interleaving the multiplexed data $A_2$ with the data $a_3$ of the class $102_3$.

Interleaved data $b_2$ are obtained.

The interleaved data $b_2$ are then encoded during an encoding step $110_3$, which provides encoded data $P_3$ and $S_3$.

The encoded data $P_3$ obtained are called "parity of $b_2$". These are redundancy data enabling the data $b_2$ to be retrieved. Since the data $b_2$ comprise the mixed data $a_1$, $a_2$ and $a_3$, the number of available redundancy data corresponding to the data $a_1$ and $a_2$ is increased.

The encoded data $S_3$ obtained are called "systematic of $b_2$".

The data A gathering the parity $P_3$ and the systematic output $S_3$ are obtained in output.

Figure 8:
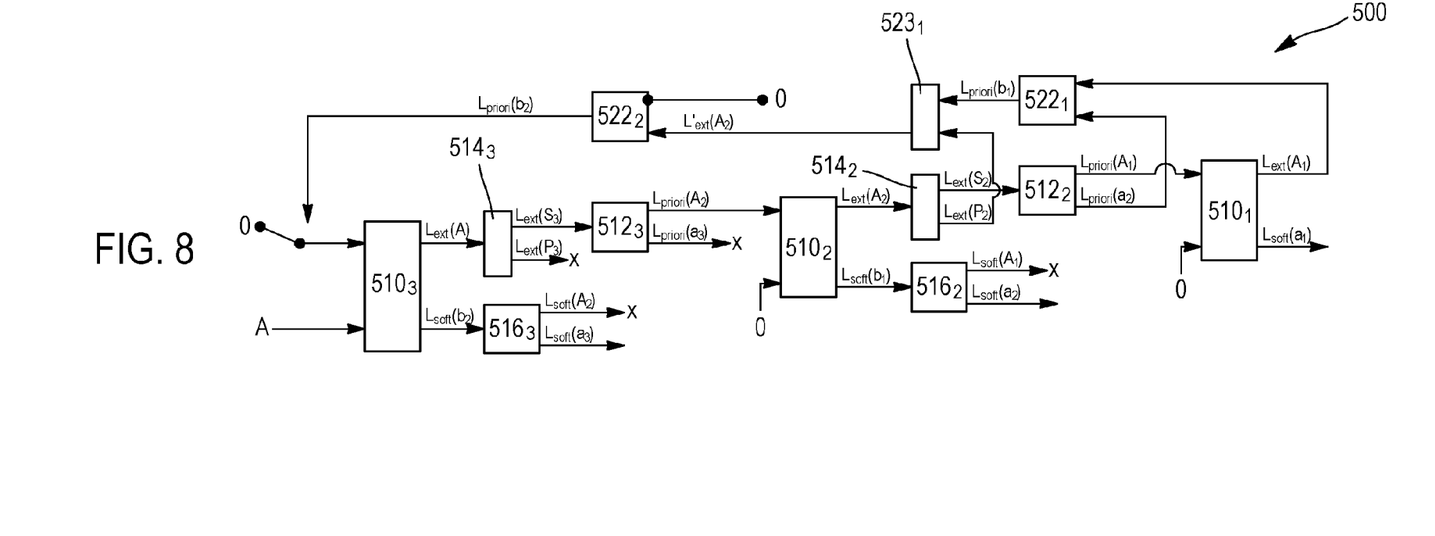
FIG. 8 illustrates a particular embodiment of the so-called "in series" decoding method according to the invention.

A particular embodiment of the so-called "in series" decoding method 500 according to the invention will now be described in reference to FIG. 8, corresponding to the encoding method of FIG. 7, and in the case where each encoder implements a recursive systematic convolutional code.

The method 500 according to the invention comprises a first decoding comprising a decoding step $510_3$ using the data A and an a priori datum initially set to zero.

An output $L_{soft}(b_2)$ and so-called extrinsic data $L_{ext}(A)$ are obtained.

The output $L_{soft}(b_2)$ enables the data $b_2$ to be assessed.

On the one hand, the following steps are implemented:
deinterleaving $516_3$ of the output $L_{soft}(b_2)$, the deinterleaving $516_3$ implementing a deinterleaving function reverse to the interleaving function implemented in the interleaving step $108_3$;
not represented demultiplexing for separating the data $L_{soft}(A_2)$ and $L_{soft}(a_3)$.

The output $L_{soft}(a_3)$ corresponds to an assessment of the data $a_3$ of the class $102_3$.

The output $L_{soft}(A_2)$ corresponds to an assessment of the data $A_2$.

So-called extrinsic data $L_{ext}(A)$ comprise information relating to an assessment of the data of the class $102_3$.

On the other hand, the following steps are implemented:
demultiplexing $514_3$ to separate the $L_{ext}(S_3)$ data relating to the systematic $S_3$ from $L_{ext}(P_3)$ relating to the parity $P_3$;
deinterleaving $512_3$ of the output $L_{ext}(S_3)$, the deinterleaving $512_3$ implementing a deinterleaving function reverse to the interleaving function implemented in the interleaving step $108_3$;
not represented demultiplexing of the deinterleaved data, to obtain a datum $L_{priori}(a_3)$ and $L_{priori}(A_2)$.

The $L_{priori}(a_3)$ data correspond to the logarithmic probabilities for each data bit of the class $102_3$ to be 0 or 1.

The $L_{priori}(a_3)$ data are used as a priori information in the following decoding step.

The not represented demultiplexing to obtain a datum $L_{priori}(a_3)$ and $L_{priori}(A_2)$ is followed by a second decoding comprising a decoding step $510_2$ of the parity $P_2$, as a function of $L_{priori}(A_2)$ and a channel datum set to zero.

An output $L_{soft}(b_1)$ and so-called extrinsic data $L_{ext}(A_2)$ are obtained.

The output $L_{soft}(b_1)$ enables the data $b_1$ to be assessed.

On the one hand, the following steps are implemented:
deinterleaving $516_2$ of the output $L_{soft}(b_1)$, the deinterleaving $516_2$ implementing a deinterleaving function reverse to the interleaving function implemented in the interleaving step $108_2$;
not represented demultiplexing for separating the data $L_{soft}(A_1)$ and $L_{soft}(a_2)$.

The output $L_{soft}(a_2)$ corresponds to an assessment of the data $a_2$ of the class $102_2$.

The output $L_{soft}(A_1)$ corresponds to an assessment of the data $A_1$.

So-called extrinsic data $L_{ext}(A_2)$ comprise information relating to an assessment of the data of the class $102_2$.

On the other hand, the following steps are implemented:
demultiplexing $514_2$ to separate the $L_{ext}(S_2)$ data relating to the systematic $S_2$ from $L_{ext}(P_2)$ relating to the parity $P_2$;
deinterleaving $512_2$ of the output $L_{ext}(S_2)$, the deinterleaving $512_2$ implementing a deinterleaving function reverse to the interleaving function implemented in the interleaving step $108_2$;
not represented demultiplexing of the deinterleaved data, to obtain a datum $L_{priori}(a_2)$ and $L_{priori}(A_1)$.

The $L_{priori}(a_2)$ data correspond to the logarithmic probabilities for each data bit of the class $102_2$ to be 0 or 1.

The $L_{priori}(A_1)$ data are used as a priori information in the following decoding step.

The demultiplexing to obtain a $L_{priori}(a_2) L_{priori}(A_1)$ datum is followed by a third decoding comprising a decoding step $510_1$ of the parity $P_1$, as a function of $L_{priori}(A_1)$ and a channel datum set to zero.

An extrinsic datum $L_{ext}(A_1)$ and an assessment of the data of the class $102_1 L_{soft}(a_1)$ are obtained.

The decoding method 500 has a feedback comprising the following steps:
interleaving $522_1$ of the $L_{ext}(A_1)$ and $L_{priori}(a_2)$ data, to obtain an interleaved datum $L_{priori}(b_1)$, and implementing an interleaving function similar to the interleaving function implemented in the interleaving $108_2$ of the series encoding method 100;
multiplexing $523_1$ of the data interleaved in the interleaving $522_1$ with $L_{ext}(P_2)$, to form a datum $L'_{ext}(A_2)$;
interleaving $522_2$ of the $L'_{ext}(A_2)$ and $L'_{ext}(a_3)$ data, to obtain an interleaved datum $L_{priori}(b_2)$, and implementing an interleaving function similar to the interleaving function implemented in the interleaving $108_3$ of the series encoding method 100 ($L'_{ext}(a_3)$ being a datum of the size of $a_3$ but assuming a series of zero values);
new iteration of the decoding step $510_3$, taking into account $L_{priori}(b_2)$ as an a priori datum;
new iteration of the steps following the decoding step $510_3$.

This feedback enables each class to benefit from the decoding accuracy obtained for other classes.

Finally, the classes not much protected can be decoded with a better accuracy than if they had been encoded separately from better protected classes.

Described encodings use for example polynomial generators.

The sizes of the different processed classes can vary.

Some classes can be provided not to be encoded.

Figure 9:
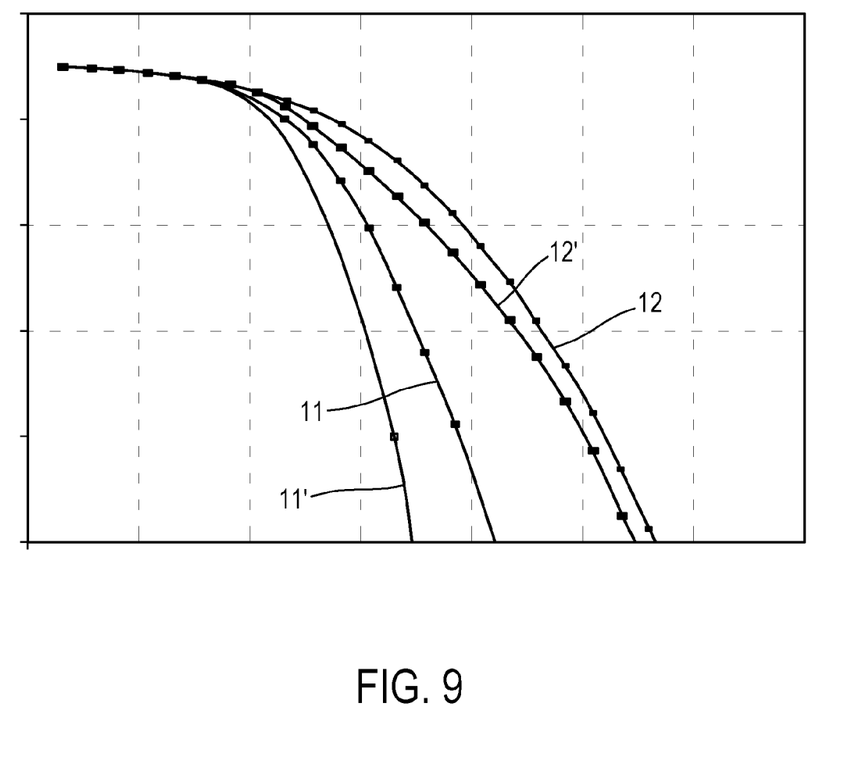
FIG. 9 illustrates bit error rate curves obtained with a decoding method according to the invention.

Bit error rate curves that can be obtained with a decoding method according to the invention are illustrated in FIG. 9.

The bit error rate is the number of erroneous bits in the assessments of the encoded data of a class, divided by the total number of bits analysed by the decoding method according to the invention. It is thus a quantity without unit.

The bit error rate is often expressed as a function of a signal to noise ratio. In FIG. 9, the abscissa axis corresponds to a bit error rate, the ordinate axis corresponds to the Eb/No ratio in dB, that is the ration in dB of an energy per bit to the power spectral density of the noise.

The example has been taken where:
after encoding, a QPSK (Quadrature Phase-Shift Keying) modulation has been implemented on a AWGN (Additive White Gaussian Noise) channel;
the frame 102 only comprises two encoded classes $102_1$ and $102_2$.

In FIG. 9, there is a ratio 2/3 between the size of the class $102_2$ less protected and the size of the frame, and a frame size of 900 bits.

The curve 11 represents the bit error rate associated with the decoding of the class $102_1$, upon the first iteration of the decoding step of the data of the class $102_1$.

The curve 12 represents the bit error rate associated with the decoding of the class $102_2$, upon the first iteration of the decoding step of the data of the class $102_2$.

The curve 11' represents the bit error rate associated with the decoding of the class $102_1$, upon the second iteration of the decoding step of the data of the class $102_1$.

The curve 12' represents the bit error rate associated with the decoding of the class $102_2$, upon the second iteration of the decoding step of the data of the class $102_2$ Thereby, it can be seen that:

the class $102_1$, which is the first class that has been encoded, reaches upon the first iteration a very good bit error rate, since many redundancy information are available to retrieve the data of the class $102_1$;

the data of the class $102_1$ encoded in the first encoding step benefit from a decoding gain similar to that obtained in a turbo-type decoding upon the second iteration;

at the first iteration, the bit error rate associated with the data of the class $102_2$ is rather low, because there are only little redundancy information available to retrieve the data of the class $102_2$;

after an iteration, the bit error rate associated with the data of the class $102_2$ is remarkably improved, and is closer to the bit error rate obtained for decoding the data of the class $102_1$, benefiting in particular from the turbo decoding gain.

The influence of a more strongly encoded class on a less encoded class depends in particular on the ratio of the size of the first class to the size of the second class, in number of bits.

After five iterations, a bit error rate of $10^{-2}$ can for example be obtained for a signal to noise ratio lower than 2 dB, with a 2.5 dB gain between the first and the last iteration.

This property of the invention is particularly interesting, because it can be seen that each class benefits from the decoding accuracy obtained for the other classes and from the "turbo" effect.

Thus, a given class can be less protected than in prior art, for a given bit error rate.

It can then be seen that fewer redundancy data can be transmitted than in prior art, to obtain a given bit error rate.

Thus, the capacity of a transmission channel for a given coverage is increased.

Thus, the range of the transmission channel for a given capacity is increased.

Of course, the invention is not limited to the examples just described and numerous improvements can be provided to these examples without departing from the scope of the invention.

For example, any decoding type implementing in particular different feedback phases can be considered.

The invention can, for example, be combined with already existing techniques, for example with puncturing techniques, which consist in erasing bits of the already encoded frame to increase the coding ratio. In this case, the redundancy of the code for each class can be reduced.

The invention can also be combined with techniques of prior art consisting in separating data of a same frame, but each data packet gathering several classes and being apt to be processed according to the invention.

The invention claimed is:

1. An error correction encoding method for encodings source digital data having the form of a frame, wherein said data can be classified into a plurality of classes, comprising the following steps:
   a first encoding step for encoding data to be encoded, formed by the data of a first class, to obtain encoded data; and
   implementing the following steps, successively for at least one other class:
   mixing the data of said other class with data encoded or to be encoded from a preceding encoding step; and
   encoding data to be encoded formed by said mixed data, to obtain encoded data.

2. The encoding method according to claim 1, further comprising assigning a priority level to each of the classes, encoding steps being performed for the classes in the decreasing order of the priority levels.

3. The encoding method according to claim 1, further comprising the steps of:
   mixing the data of said other class with data encoded or to be encoded from a preceding encoding step; and
   encoding the data to be encoded formed by said mixed data, to obtain encoded data, are implemented for all the other classes of the frame.

4. The encoding method according to claim 1, wherein at least one of the encoding steps implements a recursive systematic convolutional code.

5. The encoding method according to claim 1, wherein at least one of the encoding steps implements any digital encoding.

6. An encoding device for implementing the error correction encoding method according to claim 1, able to encode source digital data having the form of a frame, wherein said data can be classified into a plurality of classes, comprising:
   a first encoding module arranged to encode data to be encoded formed by the data of a first class, and obtaining encoded data;
   at least one set, each set being associated with one other class and comprising:
   a mixer, arranged to mix the data of said other class and the data encoded or to be encoded by a preceding encoding module, and
   an encoding module, arranged to encode data to be encoded formed by the output of the corresponding mixer and to obtain encoded data.

7. A method for decoding digital data that is arranged to decode digital data encoded in accordance with the method according to claim 1.

8. The decoding method according to claim 7, further comprising the following steps:
   for one of the classes, a first decoding step performing the following operations:
   decoding encoded data of said class;
   providing at least one extrinsic datum, provided to be used as an a priori datum for at least one decoding of the data of another class;
   providing at least one "soft" datum, for assessing the data of the class;
   a decoding step for at least one other encoded class, performing the following operations:
   decoding the encoded data of said other class, as a function of at least one extrinsic datum provided by at least one other decoding step, used as an a priori datum;
   providing at least one extrinsic datum; and
   providing at least one "soft" datum for assessing said other class.

9. The decoding method according to claim 8, wherein the decoding step is successively performed for all the classes.

10. The decoding method according to claim 8, wherein the first decoding step is performed for the latest class that has been encoded, and in that the following decoding steps are performed for classes considered in the reverse order from that in which they have been encoded.

11. The decoding method according to claim 8, wherein at least one decoding step is reiterated at least once, as a function of a priori data corresponding to extrinsic data provided by at least one step of decoding data of another class.

12. The decoding method according to claim 8, wherein all the decoding steps corresponding to each of the classes make up a decoding phase, said method comprising an iteration of said decoding phase at least twice, and in that from the second iteration, the decoding step of the data of the latest class that has been encoded is performed as a function of a priori data corresponding to extrinsic data provided by the decoding step of the data of the first class that has been encoded.

13. The decoding method according to claim 8, further comprising an initial demultiplexing step performing the separation of the encoded data of each class.

14. A decoding device, configured for implementing the decoding method according to claim 7, and comprising:
  a first decoding module arranged to decode the encoded data of a class, to provide at least one extrinsic datum to at least one other decoding module, and to provide at least one "soft" datum for assessing said class; and
  for each of the other classes, a decoding module arranged to receive as an a priori datum at least one extrinsic datum provided by at least one another decoding module, to decode the encoded data of said other class, and to provide at least one extrinsic datum, and at least one "soft" datum for assessing said other class.

15. A computer program product comprising instructions for performing the steps of the encoding method according to claim 1, when run on a computer device.

16. A computer program product comprising instructions for performing the steps of the decoding method according to claim 7, when run on a computer device.

* * * * *